(12) United States Patent
Wu et al.

(10) Patent No.: US 12,712,531 B2
(45) Date of Patent: Aug. 18, 2026

(54) ACCURATE FREQUENCY OSCILLATORS

(71) Applicant: pSemi Corporation, San Diego, CA (US)

(72) Inventors: Gary Chunshien Wu, San Diego, CA (US); Gregory Szczeszynski, Nashua, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/663,962

(22) Filed: May 14, 2024

(65) Prior Publication Data

US 2024/0396531 A1 Nov. 28, 2024

Related U.S. Application Data

(60) Provisional application No. 63/504,331, filed on May 25, 2023.

(51) Int. Cl.

| | |
|---|---|
| ***H03K 3/03*** | (2006.01) |
| ***H03K 3/011*** | (2006.01) |
| ***H03K 3/037*** | (2006.01) |
| ***H03K 3/356*** | (2006.01) |

(52) U.S. Cl.
CPC ........... *H03K 3/0315* (2013.01); *H03K 3/011* (2013.01); *H03K 3/0372* (2013.01); *H03K 3/356165* (2013.01)

(58) Field of Classification Search
CPC .... H03K 3/0315; H03K 3/011; H03K 3/0372; H03K 3/356165; H03B 5/04; H03B 5/20
USPC .................................................. 331/57, 176
See application file for complete search history.

(56) References Cited

U.S. PATENT DOCUMENTS

| | | | | |
|---|---|---|---|---|
| 5,499,214 A * | 3/1996 | Mori | .................... | H03K 3/0315 365/225.7 |
| 6,809,603 B1 * | 10/2004 | Ho | ......................... | H03K 3/011 331/185 |
| 7,180,794 B2 * | 2/2007 | Matsue | .................. | G11C 5/145 365/189.11 |

(Continued)

FOREIGN PATENT DOCUMENTS

CN 118282325 A * 7/2024 ............... H03B 5/04

*Primary Examiner* — Arnold M Kinkead
(74) *Attorney, Agent, or Firm* — Haynes and Boone, LLP

(57) ABSTRACT

Electronic oscillator designs and methods that do not require an accurate voltage and current reference to be provided, and which output an accurate frequency waveform over a range of voltage supply and temperature variations. Embodiments of the present invention are particularly well-suited for IC designs with very limited layout area and a tight oscillator frequency spread requirement. An embodiment uses a current subtraction technique that provides an essentially constant through a bias generation circuit when the voltage of the voltage source exceeds a selected value. An embodiment includes a temperature-compensation circuit, coupled to the bias generation circuit, that includes at least one NFET and at least one negative temperature coefficient resistor and is configured to pass a temperature-compensated current through the at least one NFET. An embodiment includes a ring oscillator that uses paired negative temperature coefficient resistors to provide temperature compensation for at least one ring oscillator stage.

20 Claims, 7 Drawing Sheets

(56) References Cited

U.S. PATENT DOCUMENTS

| | | | | |
|---|---|---|---|---|
| 2016/0028406 | A1* | 1/2016 | Kobayashi | H03K 3/011<br>331/57 |
| 2016/0156360 | A1* | 6/2016 | Chen | H03K 3/0315<br>331/44 |
| 2024/0223127 | A1* | 7/2024 | Li | H03K 3/354 |

* cited by examiner

200

ACCURATE FREQUENCY OSCILLATORS

CROSS-REFERENCE TO RELATED APPLICATIONS-CLAIM OF PRIORITY

The present application claims priority to the following patent application, assigned to the assignee of the present invention, the contents of which are incorporated by reference: U.S. Provisional Patent Application No. 63/504,331, filed on May 25, 2023, entitled "Accurate Frequency Oscillators".

BACKGROUND

(1) Technical Field

This invention relates to electronic circuits, and more particularly to electronic oscillators.

(2) Background

An electronic oscillator is an electronic circuit that produces a periodic, oscillating electronic signal, often a sine wave, a square wave, or a triangle wave. Oscillators are widely used in many electronic devices ranging from the simplest clock generators to complex computers and peripherals. Many oscillators require an accurate voltage and current reference to output an accurate frequency waveform.

For an integrated circuit (IC) oscillator design with very limited layout area, adding an accurate voltage and current reference may not be possible. If an accurate voltage and current reference is not available, and the voltage supply and temperature variations for an IC oscillator are large, then the oscillator may exhibit wide frequency variations under such conditions.

Accordingly, there is a need for an electronic oscillator design that does not require an accurate voltage and current reference to be provided, and which outputs an accurate frequency waveform over a range of voltage supply and temperature variations.

SUMMARY

The present invention encompasses electronic oscillator designs and methods that do not require an accurate voltage and current reference to be provided, and which output an accurate frequency waveform over a range of voltage supply and temperature variations. Embodiments of the present invention are particularly well-suited for IC designs with very limited layout area and a tight oscillator frequency spread requirement.

A first embodiment encompasses oscillator including a voltage supply variation reduction circuit configured to be coupled to a voltage source and to pass a first current when a voltage of the voltage source exceeds a selected value; a bias generation circuit, coupled to the voltage supply variation reduction circuit and configured to be coupled to the voltage source, the bias generation circuit configured to pass a second current when the voltage of the voltage source exceeds the selected value, wherein the second current is essentially constant; a temperature-compensation circuit, coupled to the bias generation circuit and configured to be coupled to the voltage source, the temperature-compensation circuit configured to pass a temperature-compensated third current through the at least one NFET; and oscillator circuitry coupled to the temperature-compensation circuit and configured to pass the temperature-compensated current and generate an output comprising a periodic waveform.

A second embodiment encompasses a ring oscillator, including an odd number of inverter stages coupled in series, at least one inverter stage including: an output node; a PFET having a conduction channel configured to be coupled to a voltage source; an NFET having a conduction channel configured to be coupled to a reference potential; an input coupled to a gate of the PFET and a gate of the NFET; a first negative temperature coefficient resistor coupled between the conduction channel of the PFET and the output node; a second negative temperature coefficient resistor coupled between the conduction channel of the NFET and the output node; and a capacitor coupled to the output node and configured to be coupled to the reference potential.

The details of one or more embodiments of the invention are set forth in the accompanying drawings and the description below. Other features, objects, and advantages of the invention should be apparent from the description and drawings, and from the claims.

DESCRIPTION OF THE DRAWINGS

Like reference numbers and designations in the various drawings indicate like elements unless the context requires otherwise.

DETAILED DESCRIPTION

The present invention encompasses electronic oscillator designs and methods that do not require an accurate voltage and current reference to be provided, and which output an accurate frequency waveform over a range of voltage supply and temperature variations. Embodiments of the present invention are particularly well-suited for $I_C$ designs with very limited layout area and a tight oscillator frequency spread requirement.

Figure 1:
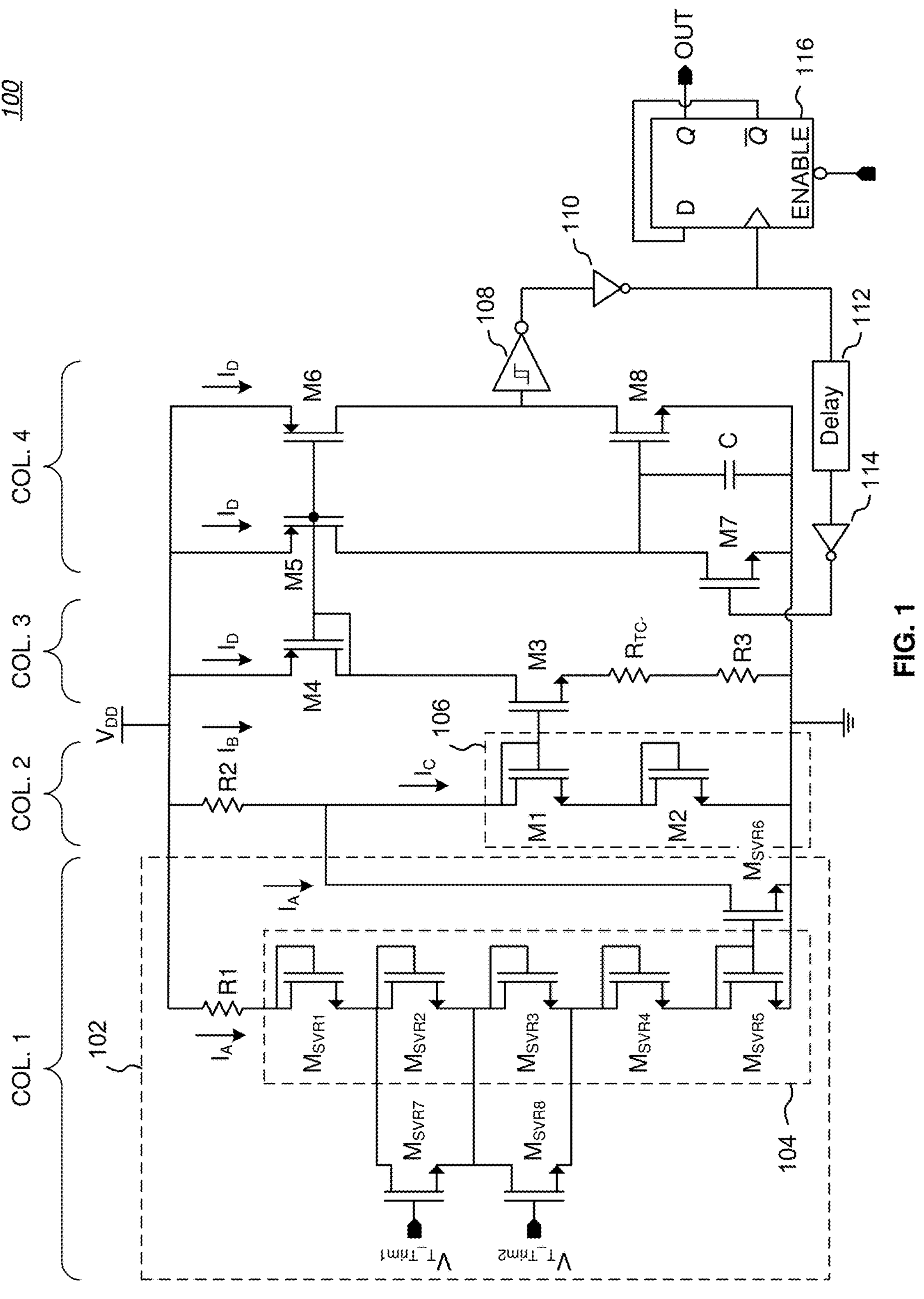
FIG. 1 is a schematic diagram of an embodiment of an accurate frequency oscillator in accordance with the present invention.

FIG. 1 is a schematic diagram of an embodiment of an accurate frequency oscillator 100 in accordance with the present invention. Certain circuit components are labeled as being in columns (COL. 1 to COL. 4) for ease of reference. The first embodiment utilizes transistors with a threshold voltage $V_{TH}$ and resistors that have the same temperature coefficient polarity to reduce temperature variation. For voltage supply variation, the first embodiments utilizes a current subtraction technique that reduces bias current variation when the supply voltage is above certain threshold levels.

In COL. 1, a first aspect of the embodiment is a voltage supply variation reduction circuit 102 for regulating, within the accurate frequency oscillator 100, variations in a supply voltage $V_{DD}$). In the illustrated example, a stack 104 of 5 diode-connected NFETs $M_{SVR1}$-$M_{SVR5}$ having conduction channels (between drain and source) coupled in series between $V_{DD}$ (through a resistor R1) and a reference potential (e.g., circuit ground) creates a voltage reference within the supply variation reduction circuit 102. The gate of the bottom diode-connected NFET $M_{SVR5}$ is coupled to the gate of an NFET $M_{SVR6}$, forming a current mirror circuit.

In the illustrated example, two bypass NFET switches, $M_{SVR7}$ and $M_{SVR8}$, are coupled in parallel with diode-connected NFETs $M_{SVR2}$ and $M_{SVR3}$ (in other embodiments, the bypass NFETS may be coupled in parallel with other diode-connected NFETs in the stack 104). When $M_{SVR7}$ and $M_{SVR8}$ are both set to an OFF state (made non-conductive) by corresponding trim control signals $V_{T\_Trim1}$ and $V_{T\_Trim2}$, the height of the stack 104 is 5 NFETs ($M_{SVR1}$-$M_{SVR5}$). In such a configuration, the stack 104 of 5 diode-connected NFETs $M_{SVR1}$-$M_{SVR5}$ blocks current $I_A$ through R1 and the stack 104 unless $V_{DD}$ exceeds the cumulative threshold voltages $V_{THN}$ of the NFETs $M_{SVR1}$-$M_{SVR5}$—that is, $I_A$ is present only if $V_{DD} \geq 5*V_{THN}$. Since NFET $M_{SVR6}$ is in a current mirror configuration, the current through NFET $M_{SVR6}$ is also equal to $I_A$ when present. The value of IA, when present, is equal to $(V_{DD}-n*V_{GSN})/R1$, where n is the number of diode-connected NFETs in the stack 104, each NFET having a gate-source voltage of $V_{GSN}$. Note that the height of the stack 104 is not limited to 5 FETs, but may have fewer or more NFETs.

If either $M_{SVR7}$ or $M_{SVR8}$ is set to an ON state (made conductive) by the corresponding trim control signal, thus bypassing the corresponding diode-connected NFET ($M_{SVR2}$ or $M_{SVR3}$ in this example), the height of the stack 104 is 4 NFETs. In such a configuration, $I_A$ is present only if $V_{DD} \geq 4*V_{THN}$.

If both $M_{SVR7}$ and $M_{SVR8}$ are set to an ON state by the corresponding trim control signals, thus bypassing both of the corresponding diode-connected NFETs ($M_{SVR2}$ and $M_{SVR3}$ in this example), the height of the stack 104 is 3 NFETs. In such a configuration, $I_A$ is present only if $V_{DD} \geq 3*V_{THN}$.

Accordingly, by adjusting trim control signals $V_{T\_Trim1}$ and $V_{T\_Trim2}$, the supply variation reduction circuit 102 can be configured to operate over a range of $V_{DD}$ values and/or to accommodate process variations in the $V_{THN}$ of the diode-connected NFETs in the stack 104. It may be beneficial to design the supply variation reduction circuit 102 so that a stack height of 4 gives a value for $4*V_{THN}$ that approximates the expected minimum $V_{DD}$, meaning that one of the trim control signals $V_{T\_Trim1}$, $V_{T\_Trim2}$ is ON while the other trim control signal is OFF. Allowing the stack height to adjust up to $5*V_{THN}$ or down to $3*V_{THN}$ provides a range of adjustability to accommodate higher or lower actual values for $V_{DD}$ and/or higher or lower values of $V_{THN}$ for the diode-connected NFETs in the stack 104. Note that additional bypass NFETS may be added to provide an even greater range of adjustability.

In COL. 2, a second stack 106 of 2 diode-connected NFETs M1-M2 has conduction channels coupled in series between $V_{DD}$ (through a resistor R2) and a reference potential (e.g., circuit ground). The output of the supply variation reduction circuit 102 (the conduction channel of NFET $M_{SVR6}$) is coupled to a node between resistor R2 and the second stack 106. In a preferred embodiment, the electrical characteristics of NFET M1 are matched to NFET $M_{SVR4}$ and the electrical characteristics of NFET M2 are matched to NFET $M_{SVR5}$.

The gate of NFET M3 in COL. 3 is coupled to the gate of NFET M1 in the second stack 106. The function of R2 and the second stack 106 is to generate a bias voltage for NFET M3 in COL. 3. The current through R2 is $I_B$, having a value equal to $(V_{DD}-2*V_{GSN})/R2$, where each diode-connected NFET in the second stack 106 has a gate-source voltage of $V_{GSN}$. The current $I_C$ through the second stack 106 is equal to $I_B-I_A$. Thus, when $V_{DD}<n*V_{THN}$, where n is the number of non-bypassed diode-connected NFETs in the stack 104, then $I_A=0$ and $I_C=I_B$.

Resistors R1 and R2 are preferably of equal value and both are preferably zero temperature coefficient resistors which exhibit little or no change in resistance with temperature over a useful range of temperatures suitable for electronic device operation. Zero temperature coefficient resistors for R1 and R2 minimize the variation of current $I_C$ over temperature, thereby increasing the accuracy of the accurate frequency oscillator 100. Resistor R1 may be trimmed to fine tune and further reduce variations in the voltage supply, also increasing accuracy.

Figure 2:
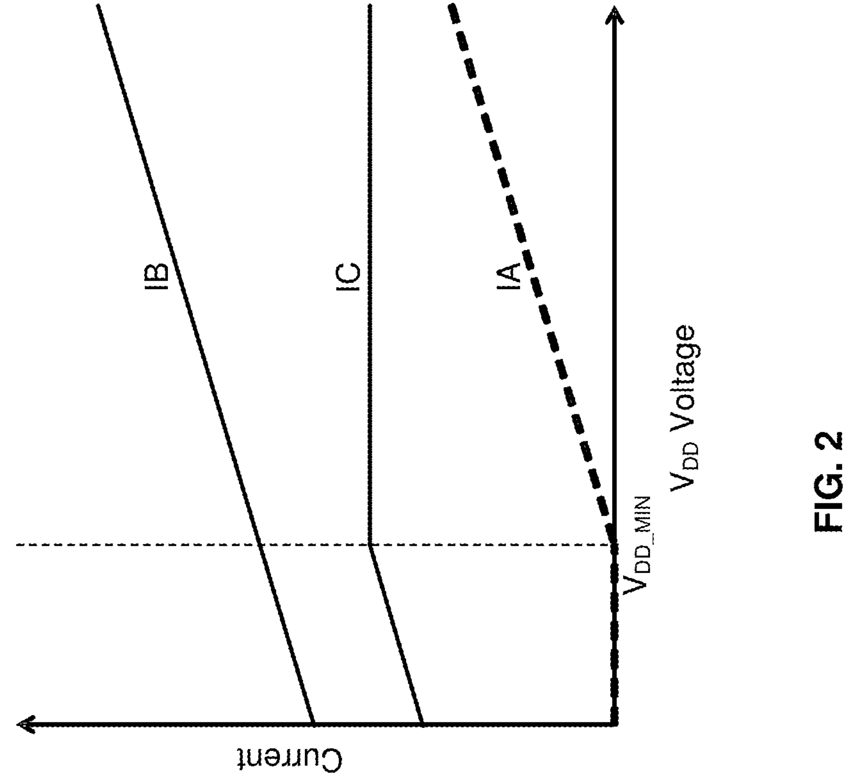
FIG. 2 is a graph of current as a function of supply voltage $V_{DD}$, showing the relationship of currents $I_A$, $I_B$, and $I_C$, to a first order of measurement.

FIG. 2 is a graph 200 of current as a function of supply voltage $V_{DD}$, showing the relationship of currents $I_A$, $I_B$, and $I_C$, to a first order of measurement. Below a minimum value $V_{DD\_MIN}$ of $V_{DD}$, current $I_A$ is zero. Current $I_A$ increases when $V_{DD}$ is at or above $V_{DD\_MIN}$. Current $I_B$ increases linearly with $V_{DD}$ when $V_{DD}$ is above $V_{DD}-2*V_{GSN}$ (the graph line for $I_B$ intersects the Y-axis at that value; below that value, $I_B$ goes to 0). Current $I_C$ increases linearly with $V_{DD}$ when $V_{DD}$ is below $V_{DD\_MIN}$, but remains essential constant with $V_{DD}$ when $V_{DD}$ is at or above $V_{DD\_MIN}$. Thus, $I_B=I_C+I_A$, or, stated equivalently, $I_C=I_B-I_A$, and accordingly $I_C$ remains essentially constant over a wide range of values for $V_{DD}$. This results in a regulated bias voltage to the gate of NFET M3 in COL. 3 despite variations in $V_{DD}$ in excess of $V_{DD\_MIN}$.

Referring back to FIG. 1, in COL. 3, the conduction channel of a diode-connected PFET M4 is coupled between $V_{DD}$ and NFET M3, which in turn is coupled to the reference potential through resistors $R_{TC-}$ and R3 in the illustrated embodiments. Note that the positions of resistors $R_{TC-}$ and R3 may be swapped in some embodiments. Resistor R3 is preferably a zero temperature coefficient resistor. Resistor $R_{TC-}$ has a negative temperature coefficient, meaning that its resistance decreases with an increase in temperature and increases with a decrease in temperature. Of note, the temperature coefficient of the threshold voltage $V_{THN}$ of NFET M3 also has a negative temperature coefficient. When $V_{THN}$ decreases, the ON resistance $R_{ON}$ of NFET M3 increases—that is, $R_{ON}$ has a positive temperature coefficient. One purpose of NFETs M1 and M3 is to replicate the source voltage of NFET M1 (or equivalently, the $V_{GS}$ of NFET M2) over to the two resistors $R_{TC-}$ and R3. NFETs M1 and M3 are typically sized quite large so that the respective $V_{GS}$ of NFETs M1 and M3 is very close to their $V_{TH}$. With that being the case, the two resistors $R_{TC-}$ and R3 will have a voltage drop that is very close to the $V_{GS}$ of NFET M2.

The aggregate temperature coefficients of $R_{TC-}$ and R3 can be varied by adjusting the ratio of resistance values of R3 versus $R_{TC-}$ such that the total resistance still meets a specified value for the application while trying to approximately match the change in resistance of $R_{TC-}$ to the change of resistance in $R_{ON}$ as a function of temperature. For example, the total temperature coefficient can be adjusted between zero ($R_{TC-}$=0 ohms) and up to the maximum provided by $R_{TC-}$ alone (i.e., R3=0 ohms).

The significance of including resistor $R_{TC-}$ is that as temperature increases, the resistance of resistor $R_{TC-}$ decreases, thus compensating for the concurrent increase in resistance of $R_{ON}$ for NFET M3 due to the temperature-induced decrease in the $V_{THN}$ of NFET M3. The reverse is also true—as temperature decreases, the resistance of resistor $R_{TC-}$ increases, thus compensating for the concurrent decrease in resistance of $R_{ON}$.

COL. 4 encompasses the actual oscillator circuitry powered by current $I_D$, where $I_D$ is equal to $V_{THN}$/(R3+$R_{TC-}$). In COL. 4, the gate of diode-connected PFET M4 is coupled to the gates of PFETs M5 and M6, which comprise current mirrors. Accordingly, the current through both PFETs M5 and M6 is equal to the temperature-compensated current $I_D$ through the circuit elements of COL. 3. The conduction channel of PFET M5 is coupled in series with the conduction channel of NFET M7, while the conduction channel of PFET M6 is coupled in series with the conduction channel of NFET M8. A capacitor C is coupled between a reference potential and a node between PFET M5 and NFET M7. The gate of NFET M8 is also coupled the node between PFET M5 and NFET M7 and to the capacitor C.

An inverting Schmitt trigger 108 has an input coupled to a node between PFET M6 and NFET M8, and an output coupled to the input of an inverter 110. In alternative embodiments, a non-inverting Schmitt trigger may be used in place of the inverting Schmitt trigger 108 and the inverter 110. The output of inverter 110 is coupled to the input of a delay circuit 112, while the output of the delay circuit 112 is coupled to the input of an inverter 114. The output of inverter 114 is coupled to the gate of NFET M7.

In operation, with NFET M7 OFF (non-conducting), the current $I_D$ through PFET M5 will charge capacitor C, eventually causing NFET M8 to couple the input of the inverting Schmitt trigger 108 to the reference potential. The current $I_D$ into the capacitor C will form a ramp. NFETs M2 and M8 are designed to be matched so that when the capacitor ramp reaches the $V_{GS}$ of NFET M2, then NFET M8 turns ON and pull the input of the inverting Schmitt trigger 108 low. The period of the oscillator is determined by the up ramp and the down ramp. The up ramp duration is determined by the equation, I=C*dv/dt, or dt=C*dv/I, where dv=$V_{GS}$ of NFET M2 and I=$I_D$=($V_{GS}$ of NFET M2)/(R3+$R_{TC-}$). Assuming that the down ramp is very fast, the period is roughly the up ramp, which is C*($V_{GS}$ of NFET M2). Thus, in logic terms, a "1" input to the gate of NFET M8 becomes a "0" at the input of the inverting Schmitt trigger 108. The output of the inverting Schmitt trigger 108 will be a logic "1" pulse, while the output out the inverter 110 will be a logic "O" pulse applied to the input of the delay circuit 112. The delay circuit 112 may be designed to have a specified time delay in transmitting its input to its output, and in some embodiments may have a variable delay that may be set programmatically.

Continuing this example of signal transitions, the delayed output of delay circuit 112 is inverted by inverter 114 to a logic "1" pulse, which turns NFET M7 ON. With NFET M7 conducting, capacitor C is discharged to the reference potential, essentially setting the input to the gate of NFET M8 to be a logic "0". A "0" input to the gate of NFET M8 becomes a "1" at the input of the inverting Schmitt trigger 108 as the current $I_D$ flows through PFET M6. The output of the inverting Schmitt trigger 108 will be a logic "0" pulse, while the output out the inverter 110 will be a logic "1" pulse applied to the input of the delay circuit 112. The delayed output of delay circuit 112 is inverted by inverter 114 to a logic "0" pulse, which turns NFET M7 OFF, allowing the current $I_D$ through PFET M5 to charge capacitor C. The cycle repeats to yield periodic pulses.

To clean up the waveform, a D-flipflop 116 has its clock input coupled to the node between PFET M6 and NFET M8. The $\overline{Q}$ output of the D-flipflop 116 is coupled to its D input, while the Q output provides a square wave clock signal with a 50% duty cycle that may be provided to other circuitry (not shown). The delay circuit 112 adjusts for the pulse width of the clock input of D-flipflop 116.

The resulting period of the accurate frequency oscillator 100 would be approximately (R3+$R_{TC-}$)*C. Trimming R3 and $R_{TC-}$ can reduce process and temperature variation, so an accurate oscillator can be designed over PVT without the use of any voltage or current reference circuit.

Another adjustment parameter for the accurate frequency oscillator 100 is the width/length (W/L) ratio of some of the FETs used in implementing the circuit. In particular, the $V_{GS}$ variation of a FET with temperature can be adjusted by sizing its W/L ratio (or equivalently, its current density) since $V_{THN}$ has a negative temperature coefficient while $V_{DSAT}$ (the voltage that signals the onset of saturation in a MOSFET) has a positive temperature coefficient and $V_{GS}≈V_{DSAT}+V_{THN}$. $V_{THN}$ varies with L only, but $V_{DSAT}$ varies with the current density. For a given current, a large W/L ratio reduces the current density and thus reduces $V_{DSAT}$, while a small W/L ratio increases the current density and thus increases $V_{DSAT}$. For example, some of the FETS in COL. 1 of FIG. 1 passing current $I_A$ can be sized to be more temperature invariant.

The accurate frequency oscillator 100 works best at single digit MHz frequencies (e.g., less than about 10 MHz). For higher frequencies (e.g., at or above about 10 MHz), a ring oscillator with capacitor load for each stage may be more suitable. The oscillator frequency will depend on the number of stages, the current drawn by each stage, and the size of the capacitor for each inter-stage output.

Figure 3:
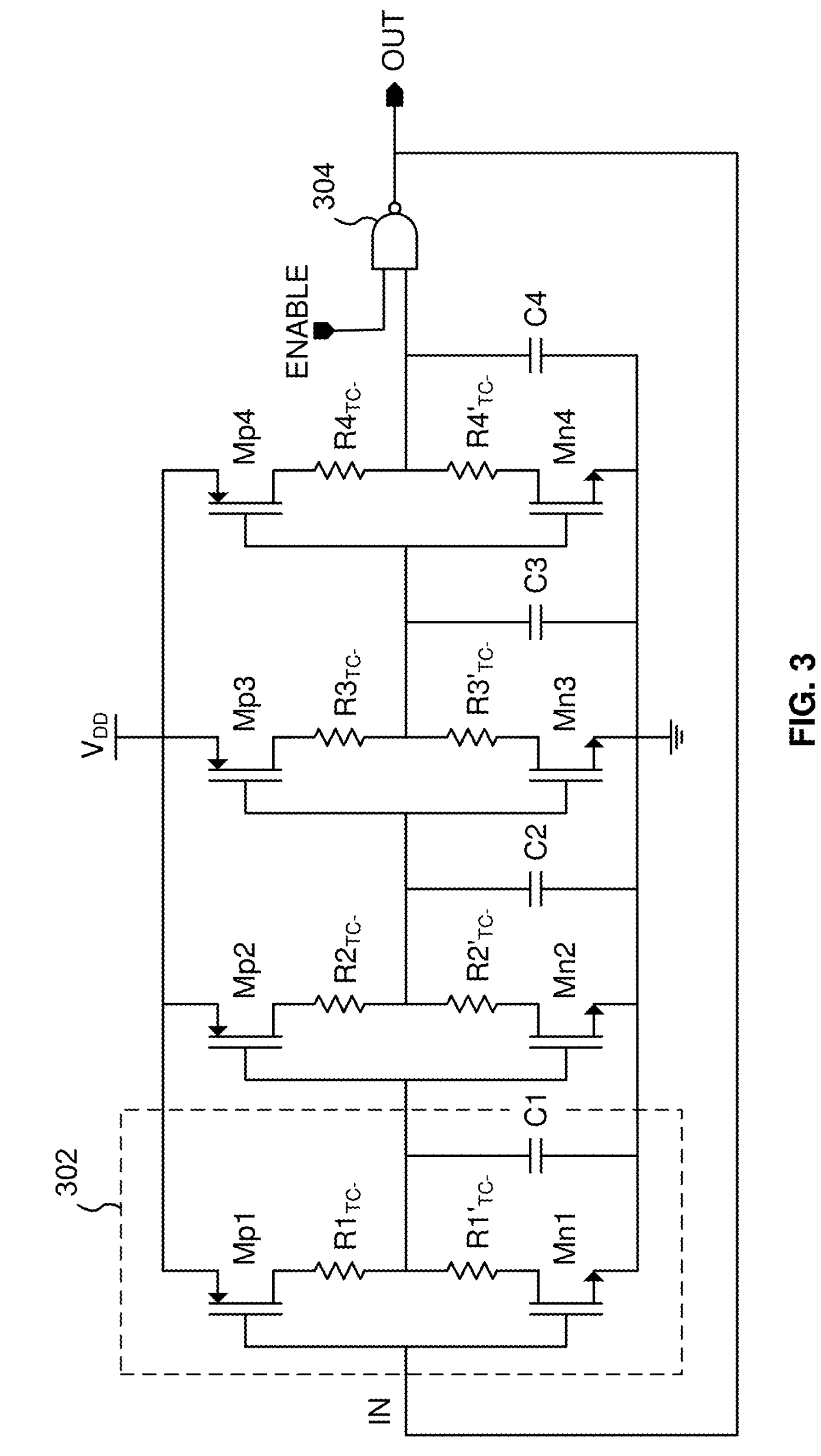
FIG. 3 is a schematic diagram of an embodiment of an accurate frequency ring oscillator in accordance with the present invention.

FIG. 3 is a schematic diagram of an embodiment of an accurate frequency ring oscillator 300 in accordance with the present invention. Each stage of a ring oscillator is often made from one simple CMOS inverter. In general, a ring oscillator built from simple CMOS inverters will have higher speed at cold temperature, and lower speed at high temperature, due to gm reduction with increasing temperature. While MOSFET $V_{TH}$ increases with decreasing temperature which would help to reduce the speed increase at cold temperature, $V_{TH}$ is typically much smaller than the voltage swing to fully compensate.

One way to reduce the frequency dependence on temperature variation is to add series resistors with negative temperature coefficients to each CMOS inverter of a ring oscillator. For example, FIG. 3 shows a 5-stage ring oscillator; other embodiments may have an odd number of stages that is more than or less than five. A first stage 302 comprises a PFET Mp1, a first negative temperature coefficient resistor R1$_{TC-}$, a second negative temperature coefficient resistor R1'$_{TC-}$, and an NFET Mn1, all coupled in series together as shown between a voltage source $V_{DD}$ and a reference potential (such as circuit ground). A capacitor C1 is coupled to the output of the first stage 302 at a node between resistors R1$_{TC-}$ and R1'$_{TC-}$, and to the reference potential.

The second, third, and fourth stages have the same configuration as the first stage. The second stage (PFET Mp2, a first negative temperature coefficient resistor R2$_{TC-}$, a second negative temperature coefficient resistor R2'$_{TC-}$, an NFET Mn2, and capacitor C2) has its input (the gates of Mp2 and Mn2) coupled to the output of the first stage. The third stage (PFET Mp3, a first negative temperature coefficient resistor $R3_{TC-}$, a second negative temperature coefficient resistor $R3'_{TC-}$, an NFET Mn3, and capacitor C3) has its input (the gates of Mp3 and Mn3) coupled to the output of the second stage. The fourth stage (PFET Mp4, a first negative temperature coefficient resistor $R4_{TC-}$, a second negative temperature coefficient resistor $R4'_{TC-}$, an NFET Mn4, and capacitor C4) has its input (the gates of Mp4 and Mn4) coupled to the output of the third stage.

In the illustrated example, the output of the fourth stage is coupled to a first input of a NAND gate 304 comprising the fifth stage of the oscillator circuit. The output of the AND gate 304 is coupled to the input of the first stage 302 (the gates of Mp1 and Mn1). A second input of the NAND gate 304 is coupled to an ENABLE control signal that provides control for whether or not to output the periodic signal generated by the accurate frequency ring oscillator 300. The NAND gate 304 may be implemented as an AND gate followed by an inverter. In some embodiments, the fifth stage of the accurate frequency ring oscillator 300 may be the same as the first stage 302 to provide temperature compensation for all stages. In some embodiments, fewer than all stages include the pairs of negative temperature coefficient resistors.

The significance of including first and second resistors $Rn_{TC-}$ and $Rn'_{TC-}$ in each ring stage n is that as temperature increases, the resistance of both resistors $Rn_{TC-}$ and $Rn'_{TC-}$ decreases, thus compensating for the concurrent increase in resistance of $R_{ON}$ for the paired FETs Mpn and Mnn due to the temperature-induced decrease in the $V_{TH}$ of the paired FETs. The reverse is also true—as temperature decreases, the resistance of both resistors $Rn_{TC-}$ and $Rn'_{TC-}$ increases, thus compensating for the concurrent decrease in resistance of $R_{ON}$ for the paired FETs Mpn and Mnn.

As was the case for the accurate frequency oscillator 100 shown in FIG. 1, another adjustment parameter for the accurate frequency ring oscillator 300 is the W/L ratio of some of the FETs used in implementing the circuit. For example, the W/L ratio of the FETs and the resistance of the negative temperature coefficient resistors may be adjusted to get a desired frequency range at a target supply voltage and to flatten the frequency variation with temperature. The W/L ratio for a particular application may be determined, for example, by modeling a circuit and programmatically varying the ratio until a satisfactory ratio is achieved.

Circuits and devices in accordance with the present invention may be used alone or in combination with other components, circuits, and devices. Embodiments of the present invention may be fabricated as integrated circuits (ICs), which may be encased in IC packages and/or in modules for case of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end-product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 4:
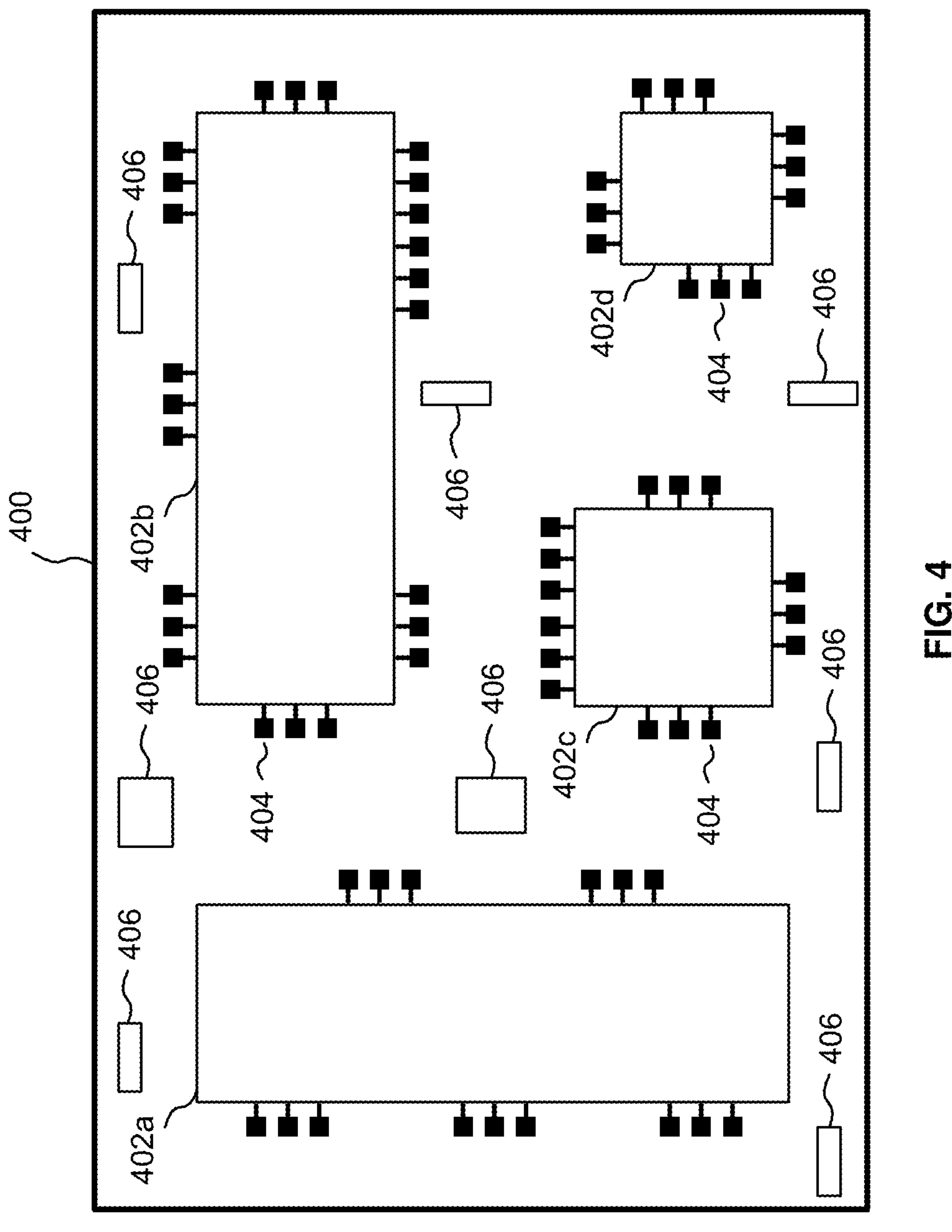
FIG. 4 is a top plan view of a substrate that may be, for example, a printed circuit board or chip module substrate (e.g., a thin-film tile).

As one example of further integration of embodiments of the present invention with other components, FIG. 4 is a top plan view of a substrate 400 that may be, for example, a printed circuit board or chip module substrate (e.g., a thin-film tile). In the illustrated example, the substrate 400 includes multiple ICs 402*a*-402*d* having terminal pads 404 which would be interconnected by conductive vias and/or traces on and/or within the substrate 400 or on the opposite (back) surface of the substrate 400 (to avoid clutter, the surface conductive traces are not shown and not all terminal pads are labelled). The ICs 402*a*-402*d* may embody, for example, signal switches, active and/or passive filters, amplifiers (including one or more LNAs), and other circuitry. For example, IC 402*b* may incorporate one or more instances of an oscillator circuit like the circuits shown in FIGS. 1 and 3.

The substrate 400 may also include one or more passive devices 406 embedded in, formed on, and/or affixed to the substrate 400. While shown as generic rectangles, the passive devices 406 may be, for example, filters, capacitors, inductors, transmission lines, resistors, antennae elements, transducers (including, for example, MEMS-based transducers, such as accelerometers, gyroscopes, microphones, pressure sensors, etc.), batteries, etc., interconnected by conductive traces on or in the substrate 400 to other passive devices 406 and/or the individual ICs 402*a*-402*d*. The front or back surface of the substrate 400 may be used as a location for the formation of other structures.

Embodiments of the present invention are useful in a wide variety of larger radio frequency (RF) circuits and systems for performing a range of functions, including (but not limited to) impedance matching circuits, RF power amplifiers, RF low-noise amplifiers (LNAs), phase shifters, attenuators, antenna beam-steering systems, charge pump devices, RF switches, etc. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be) protocols, as well as other radio communication standards and protocols.

Figure 5:
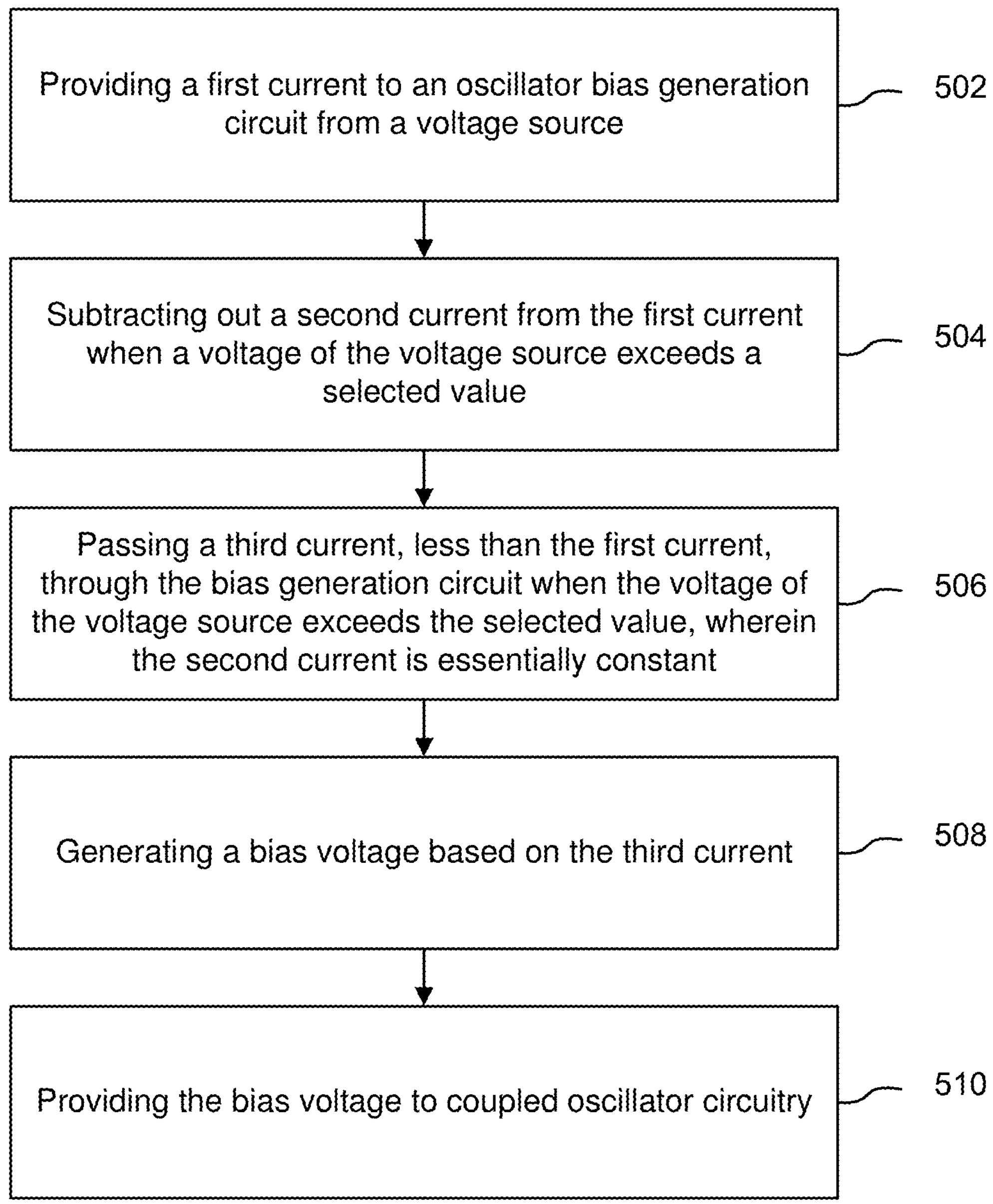
FIG. 5 is a process flow chart showing one method for compensating for supply voltage variation for an oscillator.

Another aspect of the invention includes methods for compensating for supply voltage variation and/or temperature variation for an oscillator. For example, FIG. 5 is a process flow chart 500 showing one method for compensating for supply voltage variation for an oscillator. The method includes: providing a first current to an oscillator bias generation circuit from a voltage source (Block 502); subtracting out a second current from the first current when a voltage of the voltage source exceeds a selected value (Block 504); passing a third current, less than the first current, through the bias generation circuit when the voltage of the voltage source exceeds the selected value, wherein the second current is essentially constant (Block 506); generating a bias voltage based on the third current (Block 508); and providing the bias voltage to coupled oscillator circuitry (Block 510).

Figure 6:
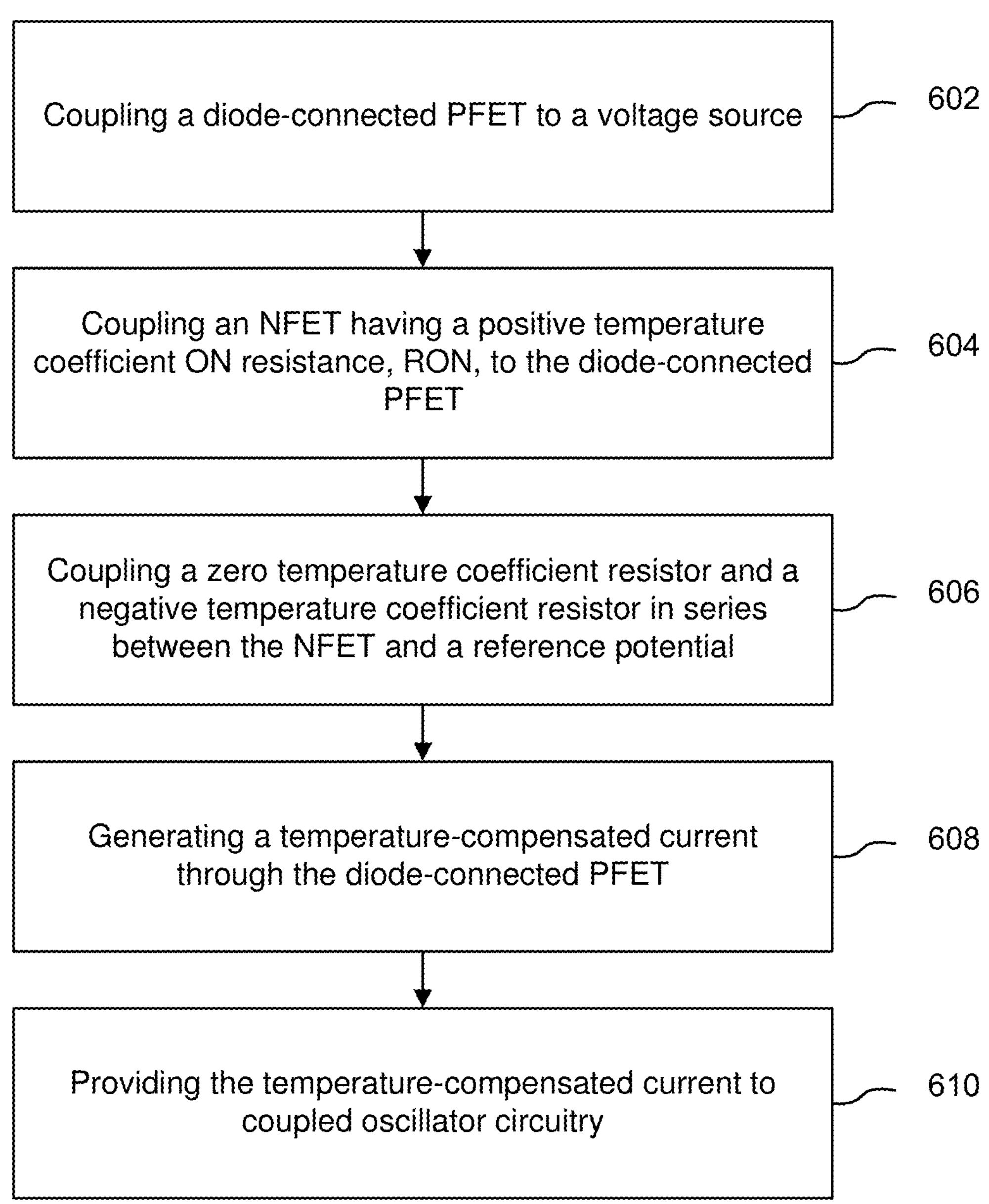
FIG. 6 is a process flow chart showing one method for compensating for temperature variation for an oscillator.

As another example, FIG. 6 is a process flow chart 600 showing one method for compensating for temperature variation for an oscillator. The method includes: coupling a diode-connected PFET to a voltage source (Block 602); coupling an NFET having a positive temperature coefficient ON resistance, $R_{ON}$, to the diode-connected PFET (Block 604); coupling a zero temperature coefficient resistor and a negative temperature coefficient resistor in series between the NFET and a reference potential (Block 606); generating a temperature-compensated current through the diode-connected PFET (Block 608); and providing the temperature-compensated current to coupled oscillator circuitry (Block 610).

Figure 7:
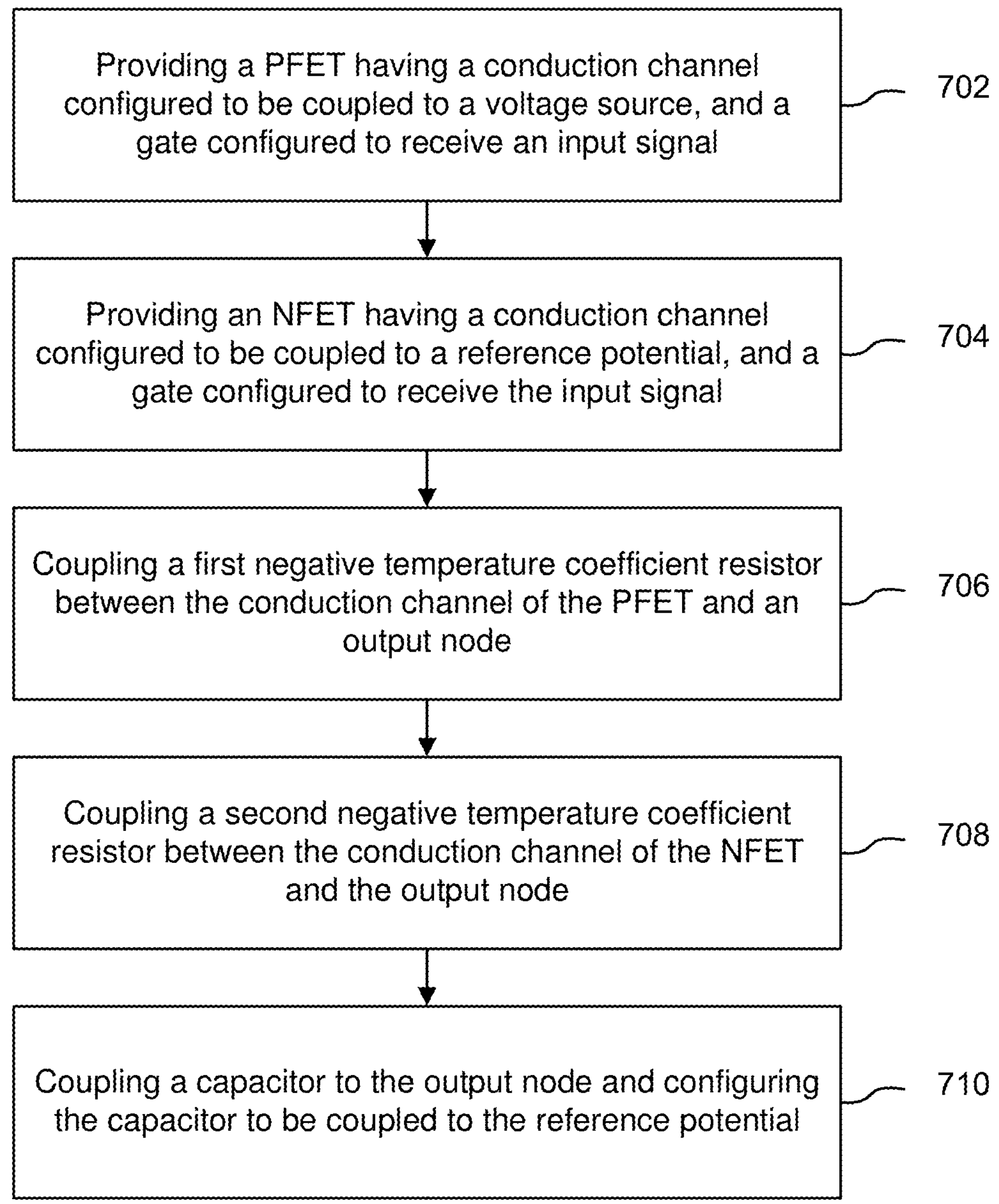
FIG. 7 is a process flow chart showing one method for compensating for temperature variation for a ring oscillator, the ring oscillator including an odd number of inverter stages coupled in series.

As yet another example, FIG. 7 is a process flow chart 700 showing one method for compensating for temperature variation for a ring oscillator, the ring oscillator including an odd number of inverter stages coupled in series. The method includes, for at least one inverter stage, providing a PFET having a conduction channel configured to be coupled to a voltage source, and a gate configured to receive an input signal (Block 702); providing an NFET having a conduction channel configured to be coupled to a reference potential, and a gate configured to receive the input signal (Block 704); coupling a first negative temperature coefficient resistor between the conduction channel of the PFET and an output node (Block 706); coupling a second negative temperature coefficient resistor between the conduction channel of the NFET and the output node (Block 708); and coupling a capacitor to the output node and configuring the capacitor to be coupled to the reference potential (Block 710).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions may be greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies, such as bipolar junction transistors (BJTs), BiCMOS, LDMOS, BCD, GaAs HBT, GaN HEMT, GaAs pHEMT, MESFET, InP HBT, InP HEMT, FinFET, GAAFET, and SiC-based device technologies, using 2-D, 2.5-D, and 3-D structures. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An oscillator, including:

a voltage supply variation reduction circuit configured to be coupled to a voltage source and to pass a first current when a voltage of the voltage source exceeds a selected value;

a bias generation circuit, coupled to the voltage supply variation reduction circuit and configured to be coupled to the voltage source, the bias generation circuit configured to pass a second current when the voltage of the voltage source exceeds the selected value, wherein the second current is essentially constant;

a temperature-compensation circuit that includes:

a diode-connected PFET having a conduction channel coupled to the voltage source;

a bias NFET having a conduction channel coupled to the conduction channel of the diode-connected PFET; and a first zero temperature coefficient resistor and a first negative temperature coefficient resistor coupled in series between the conduction channel of the bias NFET and a reference potential, wherein the temperature-compensation circuit is configured to pass a temperature-compensated third current through the bias NFET, and wherein the bias NFET has a positive temperature coefficient ON resistance, $R_{ON}$; and oscillator circuitry coupled to the temperature-compensation circuit and configured to pass the temperature-compensated third current and generate an output comprising a periodic waveform.

2. The oscillator of claim 1, wherein the bias NFET has a negative temperature coefficient threshold voltage.

3. The oscillator of claim 1, wherein the first zero temperature coefficient resistor and the first negative temperature coefficient resistor have a total temperature coefficient adjustable between zero and a maximum negative temperature coefficient provided by the first negative temperature coefficient resistor alone.

4. The oscillator of claim 1, wherein the periodic waveform is substantially constant in frequency over variations in temperature.

5. The oscillator of claim 1, wherein the periodic waveform is substantially constant in frequency over variations of the voltage of the voltage source.

6. The oscillator of claim 1, wherein the periodic waveform is substantially constant in frequency over variations in temperature and variations of the voltage of the voltage source.

7. The oscillator of claim 1, wherein the voltage supply variation reduction circuit includes:

a second zero temperature coefficient resistor coupled to the voltage source;

a stack of diode-connected NFETs having conduction channels coupled in series between the second zero temperature coefficient resistor and the reference potential; and an NFET coupled in a current mirror configuration to a diode-connected NFET in the stack of diode-connected NFETs.

8. The oscillator of claim 7, further including at least one bypass switch coupled in parallel with a corresponding diode-connected NFET in the stack of diode-connected NFETs.

9. The oscillator of claim 1, wherein the bias generation circuit includes:

a third zero temperature coefficient resistor coupled to the voltage source; and a stack of diode-connected NFETs conduction channels coupled in series between the third zero temperature coefficient resistor and the reference potential.

10. An oscillator, including:

a voltage supply variation reduction circuit configured to be coupled to a voltage source and to pass a first current when a voltage of the voltage source exceeds a selected value, the voltage supply variation reduction circuit including:

a first zero temperature coefficient resistor coupled to the voltage source;

a first stack of diode-connected NFETs having conduction channels coupled in series between the first zero temperature coefficient resistor and a reference potential; and an NFET coupled in a current mirror configuration to a diode-connected NFET in the first stack of diode-connected NFETs; and a bias generation circuit, coupled to the voltage supply variation reduction circuit and configured to be coupled to the voltage source, the bias generation circuit configured to pass a second current when the voltage of the voltage source exceeds the selected value, wherein the second current is essentially constant, the bias generation circuit including:

a second zero temperature coefficient resistor coupled to the voltage source; and a second stack of diode-connected NFETs conduction channels coupled in series between the second zero temperature coefficient resistor and the reference potential, wherein the NFET coupled in the current mirror configuration has a conduction channel coupled between the reference potential and a node between the second zero temperature coefficient resistor and the second stack of diode-connected NFETs;

a temperature-compensation circuit, coupled to the bias generation circuit and configured to be coupled to the voltage source, the temperature-compensation circuit configured to pass a temperature-compensated third current through a bias NFET, the temperature-compensation circuit including:

a diode-connected PFET having a conduction channel coupled to the voltage source;

the bias NFET having a conduction channel coupled to the conduction channel of the diode-connected PFET; and a third zero temperature coefficient resistor and a negative temperature coefficient resistor coupled in series between the conduction channel of the bias NFET and the reference potential; and oscillator circuitry coupled to the temperature-compensation circuit and configured to pass the temperature-compensated third current and generate an output comprising a periodic waveform.

11. The oscillator of claim 10, further including at least one bypass switch coupled in parallel with a corresponding diode-connected NFET in the first stack of diode-connected NFETs.

12. A ring oscillator, including an odd number of inverter stages coupled in series, at least one inverter stage including:

an output node;

a PFET having a conduction channel configured to be coupled to a voltage source;

an NFET having a conduction channel configured to be coupled to a reference potential;

an input coupled to a gate of the PFET and a gate of the NFET;

a first negative temperature coefficient resistor coupled between the conduction channel of the PFET and the output node;

a second negative temperature coefficient resistor coupled between the conduction channel of the NFET and the output node; and a capacitor coupled to the output node and configured to be coupled to the reference potential.

13. The ring oscillator of claim 12, wherein the at least one inverter stage includes a NAND gate having one input configured to be coupled to an enable control signal.

14. The ring oscillator of claim 12, wherein the ring oscillator has five stages and at least four stages include the first and second negative temperature coefficient resistors.

15. The ring oscillator of claim 12, wherein the ring oscillator is integrated into an integrated circuit.

16. The ring oscillator of claim 15, wherein the integrated circuit is included within a cellular telephone.

17. The ring oscillator of claim 15, wherein the integrated circuit is included within a 5G wireless RF system.

18. The oscillator of claim 1, wherein the oscillator is integrated into an integrated circuit.

19. The oscillator of claim 18, wherein the oscillator is included within a cellular telephone.

20. The oscillator of claim 18, wherein the integrated circuit is included within a 5G wireless RF system.

* * * * *